(12) United States Patent
Hsieh et al.

(10) Patent No.: US 11,309,298 B2
(45) Date of Patent: Apr. 19, 2022

(54) LIGHT-EMITTING DIODE DEVICE WITH DRIVING MECHANISM

(71) Applicant: MY-SEMI INC., Hsinchu County (TW)

(72) Inventors: Cheng-Han Hsieh, Hsinchu County (TW); Kuo-Lun Huang, Hsinchu (TW); Chun-Ting Kuo, Hsinchu County (TW)

(73) Assignee: MY-SEMI INC., Hsinchu County (TW)

( * ) Notice: Subject to any disclaimer, the term of this patent is extended or adjusted under 35 U.S.C. 154(b) by 127 days.

(21) Appl. No.: 17/001,662

(22) Filed: Aug. 24, 2020

(65) Prior Publication Data

US 2021/0066270 A1 Mar. 4, 2021

Related U.S. Application Data

(60) Provisional application No. 62/891,975, filed on Aug. 27, 2019.

(51) Int. Cl.
*H01L 25/075* (2006.01)
*H05B 45/20* (2020.01)
(Continued)

(52) U.S. Cl.
CPC ............ *H01L 25/167* (2013.01); *H01L 24/06* (2013.01); *H05B 45/20* (2020.01);
(Continued)

(58) Field of Classification Search
CPC ... H01L 24/06; H01L 25/167; H01L 25/0753; H01L 25/0756; H01L 33/62;
(Continued)

(56) References Cited

U.S. PATENT DOCUMENTS 5,684,523 A * 11/1997 Satoh .......................... B41J 2/45
372/45.01
8,928,023 B1 * 1/2015 Coleiny ................. H05B 45/00
362/249.02

(Continued)

FOREIGN PATENT DOCUMENTS

TW 201721833 A 6/2017

*Primary Examiner* — Haissa Philogene
(74) *Attorney, Agent, or Firm* — Li & Cai Intellectual Property Office

(57) ABSTRACT

A light-emitting diode device with a driving mechanism is provided. A first light-emitting diode chip, a second light-emitting diode chip and a third light-emitting diode chip are arranged on a driver circuit chip, and respectively configured to emit red light, green light and blue light. A first contact of the light-emitting diode chip, a first contact of the second light-emitting diode chip and a first contact of the third light-emitting diode chip are respectively in direct electrical contact with a first output contact, a second output contact and a third output contact of the driver circuit chip in a flip-chip manner. A second contact of the first light-emitting diode chip, a second contact of the second light-emitting diode chip and a second contact of the third light-emitting diode chip are in direct electrical contact with a common contact of the driver circuit chip.

17 Claims, 9 Drawing Sheets

(51) Int. Cl.
 *H01L 25/16* (2006.01)
 *H01L 23/00* (2006.01)
(52) U.S. Cl.
 CPC ............... *H01L 2224/08123* (2013.01); *H01L 2224/08145* (2013.01); *H01L 2924/12041* (2013.01); *H01L 2924/1426* (2013.01)
(58) Field of Classification Search
 CPC .......... H01L 2224/08135; H01L 2224/081137; H01L 2224/08123; H01L 2224/08151; H01L 2224/08145; H01L 2924/12041; H01L 2924/1426; H05B 45/20; H05B 45/14; H05B 45/24; H05B 45/30
 See application file for complete search history.

(56) References Cited

U.S. PATENT DOCUMENTS

| | | | |
|---|---|---|---|
| 11,244,931 B2* | 2/2022 | Kawano | H01L 33/60 |
| 2015/0377695 A1* | 12/2015 | Chang | G01J 3/465 |
| | | | 250/208.2 |
| 2016/0320004 A1* | 11/2016 | Tudorica | F21V 29/83 |
| 2020/0387029 A1* | 12/2020 | Bae | G02F 1/133603 |

* cited by examiner

LIGHT-EMITTING DIODE DEVICE WITH DRIVING MECHANISM

CROSS-REFERENCE TO RELATED PATENT APPLICATION

This application claims the benefit of priority from the U.S. Provisional Patent Application Ser. No. 62/891,975, filed on Aug. 27, 2019, which application is incorporated herein by reference in its entirety.

Some references, which may include patents, patent applications and various publications, may be cited and discussed in the description of this disclosure. The citation and/or discussion of such references is provided merely to clarify the description of the present disclosure and is not an admission that any such reference is "prior art" to the disclosure described herein. All references cited and discussed in this specification are incorporated herein by reference in their entireties and to the same extent as if each reference was individually incorporated by reference.

FIELD OF THE DISCLOSURE

The present disclosure relates to a light-emitting diode device, and more particularly to a light-emitting diode device with a driving mechanism.

BACKGROUND OF THE DISCLOSURE

Light-emitting diodes (LEDs) are made of semiconductor materials and used to convert electrical energy into light energy. The light-emitting diodes have been widely applied in various fields of display chips, automobile direction lights, illumination devices for decoration, and so on. However, in a conventional light-emitting device, light-emitting diode chips are disposed adjacent to a driver circuit on the same plane, and connected to the driver circuit through bonding wires. However, this overall configuration occupies a very large space such that a size of the conventional light-emitting device cannot be reduced, and light emitted by the light-emitting diode chips are blocked by the adjacent driver circuit such that mixing quality of the light is deteriorated.

SUMMARY OF THE DISCLOSURE

In response to the above-referenced technical inadequacies, the present disclosure provides a light-emitting diode device with a driving mechanism. The light-emitting diode device includes a first light-emitting diode chip, a second light-emitting diode chip, a third light-emitting diode chip and a driver circuit chip. The first light-emitting diode chip is configured to emit red light. The second light-emitting diode chip is configured to emit green light. The third light-emitting diode chip is configured to emit blue light. The driver circuit chip is in direct electrical contact with the first light-emitting diode chip, the second light-emitting diode chip and the third light-emitting diode chip. The driver circuit chip is configured to drive the first light-emitting diode chip to emit the red light, the second light-emitting diode chip to emit the green light and the third light-emitting diode chip to emit the blue light. The first light-emitting diode chip, the second light-emitting diode chip and the third light-emitting diode chip are disposed on the driver circuit chip. A first contact of the first light-emitting diode chip is in direct electrical contact with a first output contact of the driver circuit chip in a flip-chip manner. A first contact of the second light-emitting diode chip is in direct electrical contact with a second output contact of the driver circuit chip in the flip-chip manner. A first contact of the third light-emitting diode chip is in direct electrical contact with a third output contact of the driver circuit chip in the flip-chip manner. Any two or three of a second contact of the first light-emitting diode chip, a second contact of the second light-emitting diode chip and a second contact of the third light-emitting diode chip are in direct electrical contact with a common contact of the driver circuit chip.

In certain embodiments, a total area of the first light-emitting diode chip, the second light-emitting diode chip and the third light-emitting diode chip is smaller than an area of the driver circuit chip.

In certain embodiments, the first contacts of the first light-emitting diode chip, the second light-emitting diode chip and the third light-emitting diode chip are cathodes. The second contacts of the first light-emitting diode chip, the second light-emitting diode chip and the third light-emitting diode chip are anodes.

In certain embodiments, the first contacts of the first light-emitting diode chip, the second light-emitting diode chip and the third light-emitting diode chip are anodes. The second contacts of the first light-emitting diode chip, the second light-emitting diode chip and the third light-emitting diode chip are cathodes.

In certain embodiments, the driver circuit chip has an electrical contact pad, a serial data input pad and a serial data output pad. The electrical contact pad is grounded. The common contact of the driver circuit chip is connected to an input voltage source. The serial data input pad receives a first control signal. The serial data output pad outputs the first control signal. The first light-emitting diode chip, the second light-emitting diode chip and the third light-emitting diode chip emit light according to the first control signal.

In certain embodiments, the driver circuit chip further has a serial clock input pad and a serial clock output pad. The serial clock input pad receives a second control signal. The serial clock output pad outputs the second control signal. The first light-emitting diode chip, the second light-emitting diode chip and the third light-emitting diode chip emit light according to the first control signal and the second control signal.

In certain embodiments, one or more of the common contact of the driver circuit chip, the electrical contact pad, the serial data input pad, the serial data output pad, the serial clock input pad and the serial clock output pad are connected to external wires through bonding wires, through-silicon vias, or metal layers formed along sides of the driver circuit chip.

In certain embodiments, the driver circuit chip has an electrical contact pad, a serial data input pad and a serial data output pad. The electrical contact pad is connected to an input voltage source. The common contact of the driver circuit chip is grounded. The serial data input pad receives a first control signal. The serial data output pad outputs the first control signal. The first light-emitting diode chip, the second light-emitting diode chip and the third light-emitting diode chip emit light according to the first control signal.

In certain embodiments, the driver circuit chip further has a serial clock input pad and a serial clock output pad. The serial clock input pad receives a second control signal. The serial clock output pad outputs the second control signal. The first light-emitting diode chip, the second light-emitting diode chip and the third light-emitting diode chip emit light according to the first control signal and the second control signal.

In certain embodiments, one or more of the common contact of the driver circuit chip, the electrical contact pad, the serial data input pad, the serial data output pad, the serial clock input pad and the serial clock output pad are connected to external wires through bonding wires, through-silicon vias, or metal layers formed along sides of the driver circuit chip.

In certain embodiments, the driver circuit chip has an input power pad, a ground pad, a serial data input pad and a serial data output pad. The input power pad is connected to an input voltage source. The ground pad is grounded. The common contact of the driver circuit chip is connected to the input power pad. The serial data input pad receives a first control signal, the serial data output pad outputs the first control signal, the first light-emitting diode chip, the second light-emitting diode chip and the third light-emitting diode chip emit light according to the first control signal.

In certain embodiments, the driver circuit chip further has a serial clock input pad and a serial clock output pad. The serial clock input pad receives a second control signal. The serial clock output pad outputs the second control signal. The first light-emitting diode chip, the second light-emitting diode chip and the third light-emitting diode chip emit light according to the first control signal and the second control signal.

In certain embodiments, one or more of the common contact of the driver circuit chip, the input power pad, the ground pad, the serial data input pad, the serial data output pad, the serial clock input pad and the serial clock output pad are connected to external wires through bonding wires, through-silicon vias, or metal layers formed along sides of the driver circuit chip.

In certain embodiments, the driver circuit chip has an input power pad, a ground pad, a serial data input pad and a serial data output pad. The input power pad is connected to an input voltage source. The ground pad is grounded. The common contact of the driver circuit chip is connected to the ground pad. The serial data input pad receives a first control signal. The serial data output pad outputs the first control signal. The first light-emitting diode chip, the second light-emitting diode chip and the third light-emitting diode chip emit light according to the first control signal.

In certain embodiments, the driver circuit chip further has a serial clock input pad and a serial clock output pad. The serial clock input pad receives a second control signal. The serial clock output pad outputs the second control signal, the first light-emitting diode chip. The second light-emitting diode chip and the third light-emitting diode chip emit light according to the first control signal and the second control signal.

In certain embodiments, one or more of the common contact of the driver circuit chip, the input power pad, the ground pad, the serial data input pad, the serial data output pad, the serial clock input pad and the serial clock output pad are connected to external wires through bonding wires, through-silicon vias, or metal layers formed along sides of the driver circuit chip.

In addition, the present disclosure provides a light-emitting diode device with a driving mechanism. The light-emitting diode device includes a light-emitting diode package and a driver circuit chip. The light-emitting diode package includes a first light-emitting diode chip, a second light-emitting diode chip, a third light-emitting diode chip and an encapsulation layer. The first light-emitting diode chip is configured to emit red light. The second light-emitting diode chip is configured to emit green light. The third light-emitting diode chip is configured to emit blue light. The driver circuit chip is in direct electrical contact with the first light-emitting diode chip, the second light-emitting diode chip and the third light-emitting diode chip. The driver circuit chip is configured to drive the first light-emitting diode chip to emit the red light, the second light-emitting diode chip to emit the green light and the third light-emitting diode chip to emit the blue light. The first light-emitting diode chip, the second light-emitting diode chip and the third light-emitting diode chip are disposed on the driver circuit chip. A first contact of the first light-emitting diode chip is in direct electrical contact with a first output contact of the driver circuit chip. A first contact of the second light-emitting diode chip is in direct electrical contact with a second output contact of the driver circuit chip. A first contact of the third light-emitting diode chip is in direct electrical contact with a third output contact of the driver circuit chip. A common contact of a second contact of the first light-emitting diode chip, a second contact of the second light-emitting diode chip and a second contact of the third light-emitting diode chip is in direct electrical contact with a common contact of the driver circuit chip.

As described above, the present disclosure provides the light-emitting diode device with the driving mechanism, which includes the plurality of light-emitting diode chips stacked on the driving circuit chip. The light-emitting diode chips are in direct electrical contact with the driving circuit chip without using bonding wires, thereby saving an area of the light-emitting diode device. Therefore, a size of the light-emitting diode device of the present disclosure can be minimized, and the light emitted by the light-emitting diode chips can be prevented from being blocked by the driver circuit chip such that mixing quality of the light is optimized.

These and other aspects of the present disclosure will become apparent from the following description of the embodiment taken in conjunction with the following drawings and their captions, although variations and modifications therein may be affected without departing from the spirit and scope of the novel concepts of the disclosure.

BRIEF DESCRIPTION OF THE DRAWINGS

The present disclosure will become more fully understood from the following detailed description and accompanying drawings.

DETAILED DESCRIPTION OF THE EXEMPLARY EMBODIMENTS

Figure 1:
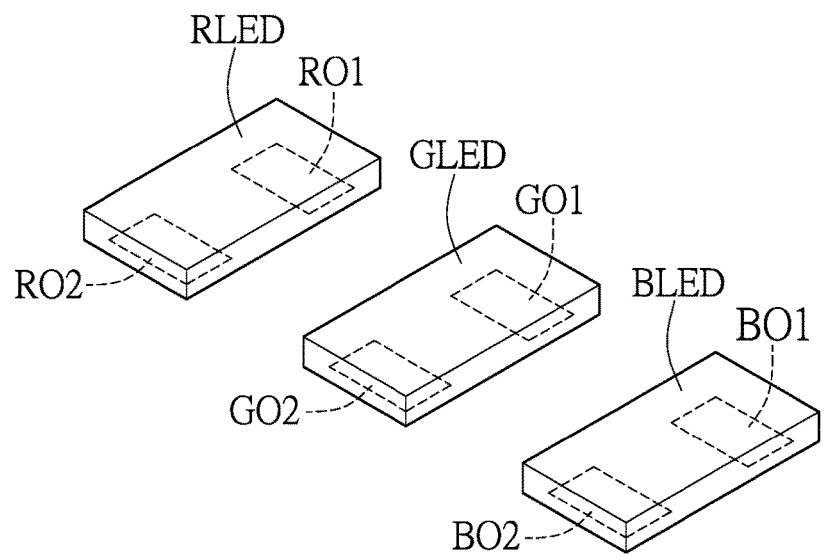
FIG. 1 is a schematic diagram of a plurality of light-emitting diode chips of a light-emitting diode device with a driving mechanism according to a first embodiment of the present disclosure.

The present disclosure is more particularly described in the following examples that are intended as illustrative only since numerous modifications and variations therein will be apparent to those skilled in the art. Like numbers in the drawings indicate like components throughout the views. As used in the description herein and throughout the claims that follow, unless the context clearly dictates otherwise, the meaning of "a", "an", and "the" includes plural reference, and the meaning of "in" includes "in" and "on". Titles or subtitles can be used herein for the convenience of a reader, which shall have no influence on the scope of the present disclosure.

The terms used herein generally have their ordinary meanings in the art. In the case of conflict, the present document, including any definitions given herein, will prevail. The same thing can be expressed in more than one way. Alternative language and synonyms can be used for any term(s) discussed herein, and no special significance is to be placed upon whether a term is elaborated or discussed herein. A recital of one or more synonyms does not exclude the use of other synonyms. The use of examples anywhere in this specification including examples of any terms is illustrative only, and in no way limits the scope and meaning of the present disclosure or of any exemplified term. Likewise, the present disclosure is not limited to various embodiments given herein. Numbering terms such as "first", "second" or "third" can be used to describe various components, signals or the like, which are for distinguishing one component/signal from another one only, and are not intended to, nor should be construed to impose any substantive limitations on the components, signals or the like.

Figure 2:
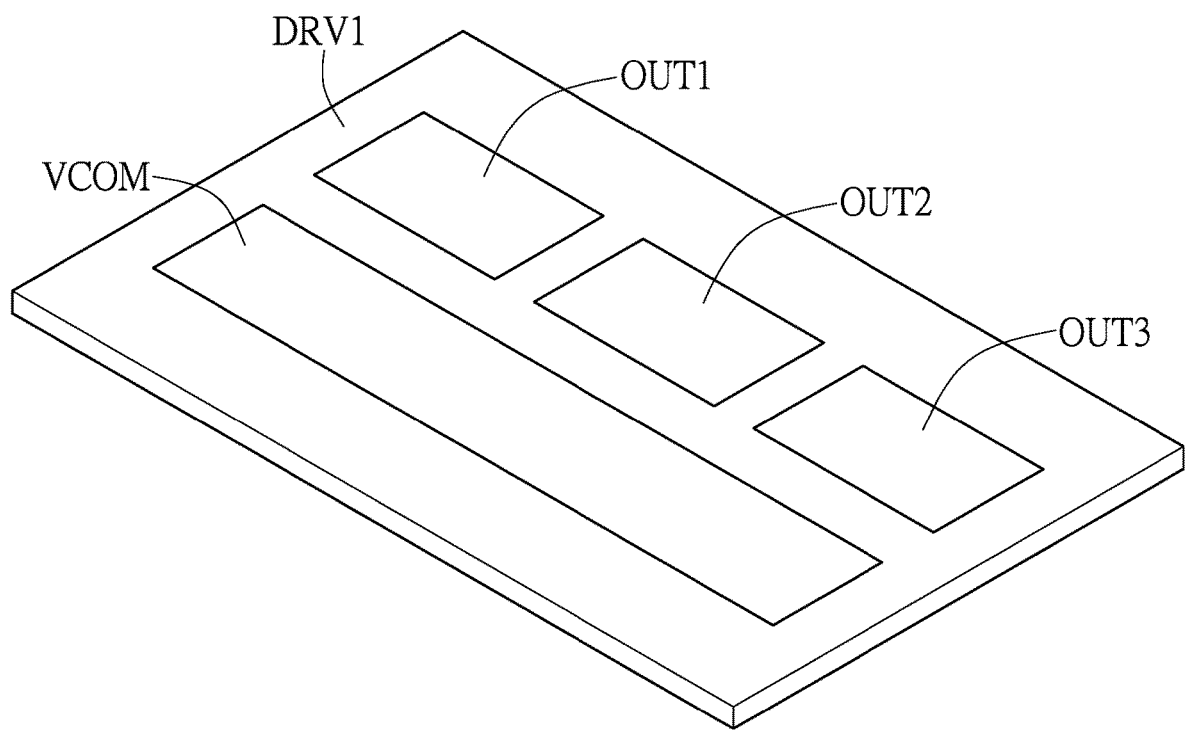
FIG. 2 is a schematic diagram of a driver circuit chip of the light-emitting diode device with the driving mechanism according to the first embodiment to a ninth embodiment of the present disclosure.
Figure 3:
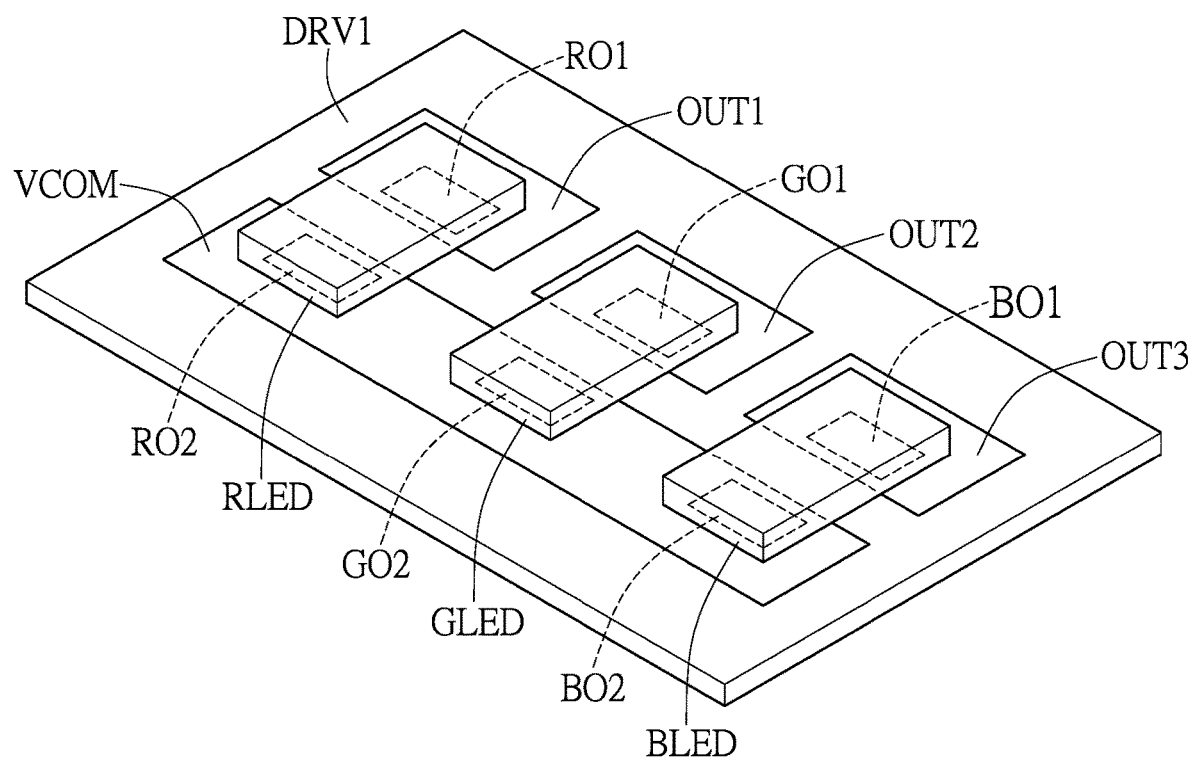
FIG. 3 is a schematic diagram of the plurality of light-emitting diode chips disposed on the driver circuit chip in the light-emitting diode device with driving mechanism according to the first embodiment of the present disclosure.

Reference is made to FIGS. 1 to 3, wherein FIG. 1 is a schematic diagram of the plurality of light-emitting diode chips of a light-emitting diode device with a driving mechanism according to a first embodiment of the present disclosure, FIG. 2 is a schematic diagram of a driver circuit chip of the light-emitting diode device with the driving mechanism according to the first embodiment to a ninth embodiment of the present disclosure, and FIG. 3 is a schematic diagram of the plurality of light-emitting diode chips disposed on the driver circuit chip in the light-emitting diode device with driving mechanism according to the first embodiment of the present disclosure.

In the embodiment, the light-emitting diode device may include a first light-emitting diode chip RLED, a second light-emitting diode chip GLED and a third light-emitting diode chip BLED as shown in FIG. 1. The first light-emitting diode chip RLED emits red light. The second light-emitting diode chip GLED emits green light. The third light-emitting diode chip BLED emits blue light.

As shown in FIG. 1, the first light-emitting diode chip RLED has a first contact RO1 and a second contact RO2. The second light-emitting diode chip GLED has a first contact GO1 and a second contact GO2. The third light-emitting diode chip BLED has a first contact BO1 and a second contact BO2.

As shown in FIG. 2, in the embodiment, the light-emitting diode device may further include a driver circuit chip DRV1. The driver circuit chip DRV1 may have a first output contact OUT1, a second output contact OUT2, a third output contact OUT3 and a common contact VCOM.

As shown in FIG. 3, the first light-emitting diode chip RLED, the second light-emitting diode chip GLED and the third light-emitting diode chip BLED as shown in FIG. 1 are arranged on the driver circuit chip DRV1 shown in FIG. 2. A total area of the first light-emitting diode chip RLED, the second light-emitting diode chip GLED and the third light-emitting diode chip BLED is smaller than an area of the driver circuit chip DRV1.

The first contact RO1 of the first light-emitting diode chip RLED is in direct electrical contact with the first output contact OUT1 of the driver circuit chip DRV1 in a manner such as a flip-chip manner. The first contact GO1 of the second light-emitting diode chip GLED is in direct electrical contact with the second output contact OUT2 of the driver circuit chip DRV1 in a manner such as the flip-chip manner. The first contact BO1 of the third light-emitting diode chip BLED is in direct electrical contact with the third output contact OUT3 of the driver circuit chip DRV1 in a manner such as the flip-chip manner.

The second contact RO2 of the first light-emitting diode chip RLED, the second contact GO2 of the second light-emitting diode chip GLED and the second contact BO2 of the third light-emitting diode chip BLED are in direct electrical contact with the common contact VCOM of the driver circuit chip DRV1.

A driver circuit of the driver circuit chip DRV1 is configured to drive synchronously or asynchronously the first light-emitting diode chip RLED to emit the red light, the second light-emitting diode chip GLED to emit the green light and the second light-emitting diode chip GLED to emit the blue light.

Figure 4:
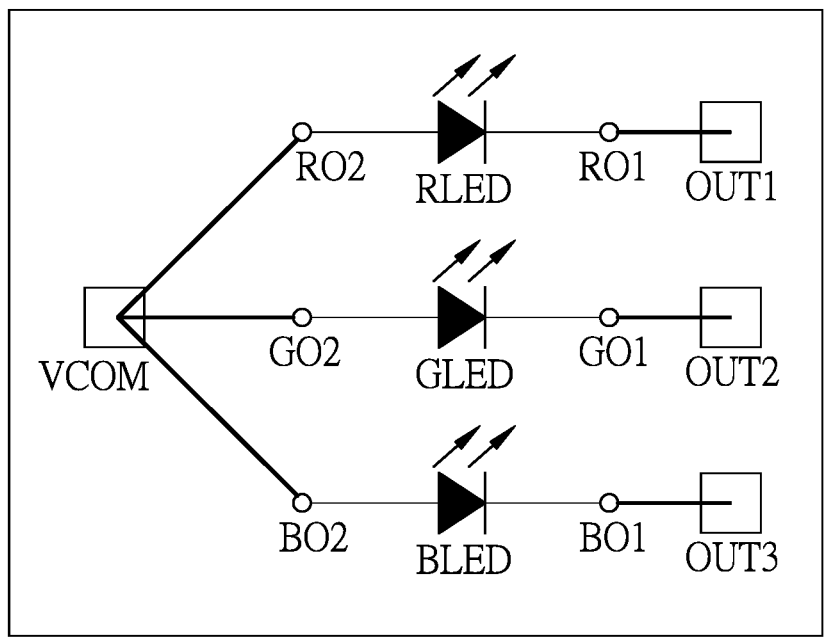
FIG. 4 is a schematic diagram of a plurality of light-emitting diode chips each having an anode that is in direct electrical contact with a common contact of the driver circuit chip and having a cathode that is in direct electrical contact with output contacts of the driver circuit chip in the light-emitting diode device with the driving mechanism according to the second embodiment of the present disclosure.

Reference is made to FIG. 4, which is a schematic diagram of a plurality of light-emitting diode chips each having an anode that is in direct electrical contact with a common contact of the driver circuit chip and having a cathode that is in direct electrical contact with output contacts of the driver circuit chip in the light-emitting diode device with the driving mechanism according to the second embodiment of the present disclosure.

As shown in FIG. 4, the first contact RO1 of the cathode of the first light-emitting diode chip RLED is in direct electrical contact with the first output contact OUT1 of the driver circuit chip DRV1. The first contact GO1 of the cathode of the second light-emitting diode chip GLED is in direct electrical contact with the second output contact OUT2 of the driver circuit chip DRV1. The first contact BO1 of the cathode of the third light-emitting diode chip BLED is in direct electrical contact with the third output contact OUT3 of the driver circuit chip DRV1.

Any two or three of the second contact RO2 of the anode of the first light-emitting diode chip RLED, the second contact GO2 of the anode of the second light-emitting diode chip GLED and the second contact BO2 of the anode of the third light-emitting diode chip BLED are in direct electrical contact with the common contact VCOM of the driver circuit chip DRV1.

Figure 5:
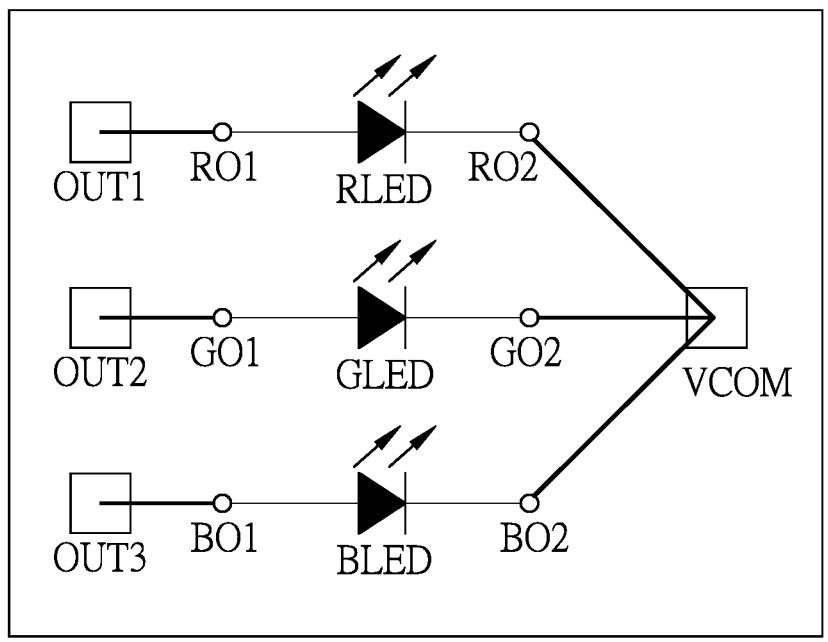
FIG. 5 is a schematic diagram of a plurality of light-emitting diode chips each having an cathode that is in direct electrical contact with the common contact of the driver circuit chip and having a anode that is in direct electrical contact with the output contacts of the driver circuit chip in the light-emitting diode device with the driving mechanism according to a second embodiment of the present disclosure.

Reference is made to FIG. 5, which is a schematic diagram of a plurality of light-emitting diode chips each having an cathode that is in direct electrical contact with the common contact of the driver circuit chip and having an anode that is in direct electrical contact with the output contacts of the driver circuit chip in the light-emitting diode device with the driving mechanism according to a second embodiment of the present disclosure.

As shown in FIG. 5, the first contact RO1 of the anode of the first light-emitting diode chip RLED is in direct electrical contact with the first output contact OUT1 of the driver circuit chip DRV1. The first contact GO1 of the anode of the second light-emitting diode chip GLED is in direct electrical contact with the second output contact OUT2 of the driver circuit chip DRV1. The first contact BO1 of the anode of the third light-emitting diode chip BLED is in direct electrical contact with the third output contact OUT3 of the driver circuit chip DRV1.

Any two or three of the second contact RO2 of the cathode of the first light-emitting diode chip RLED, the second contact GO2 of the cathode of the second light-emitting diode chip GLED and the second contact BO2 of the cathode of the third light-emitting diode chip BLED are in direct electrical contact with the common contact VCOM of the driver circuit chip DRV1.

Figure 6:
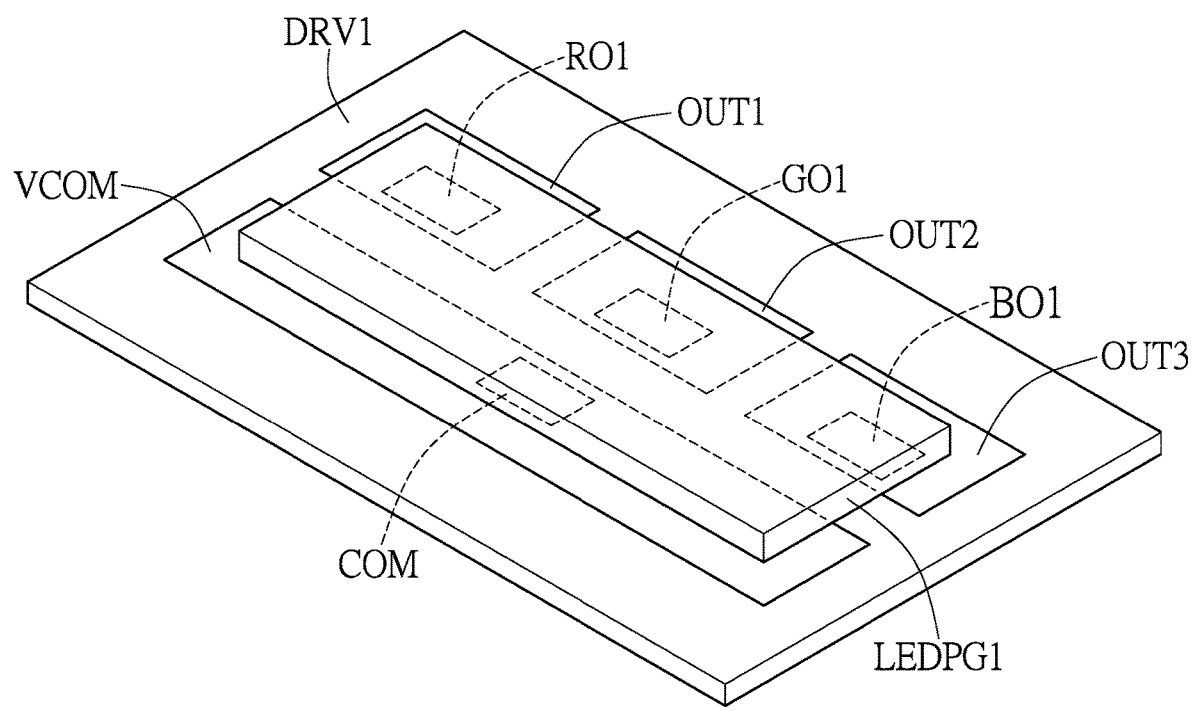
FIG. 6 is a schematic diagram of a light-emitting diode package disposed on the driver circuit chip in the light-emitting diode device with the driving mechanism according to the fourth embodiment of the present disclosure.

Reference is made to FIG. 6, which is a schematic diagram of a light-emitting diode package disposed on the driver circuit chip in the light-emitting diode device with the driving mechanism according to the fourth embodiment of the present disclosure.

In the embodiment, the light-emitting diode device may include a light-emitting diode package LEDPG1 shown in FIG. 6. The light-emitting diode package LEDPG1 shown in FIG. 6 may include the first light-emitting diode chip RLED, the second light-emitting diode chip GLED, the third light-emitting diode chip BLED as shown in FIG. 1, and an encapsulation layer.

As shown in FIG. 6, the light-emitting diode package LEDPG1 has first contacts RO1, GO1, BO1 and a common contact COM. In the embodiment, the light-emitting diode device may include the light-emitting diode package LEDPG1 and the driver circuit chip DRV1. The light-emitting diode package LEDPG1 may be disposed on the driver circuit chip DRV1.

The first contact RO1 of the light-emitting diode package LEDPG1 is in direct electrical contact with the first output contact OUT1 of the driver circuit chip DRV1 in a manner such as a flip-chip manner. The first contact GO1 of the light-emitting diode package LEDPG1 is in direct electrical contact with the second output contact OUT2 of the driver circuit chip DRV1 in a manner such as the flip-chip manner. The first contact BO1 of the light-emitting diode package LEDPG1 is in direct electrical contact with the third output contact OUT3 of the driver circuit chip DRV1 in a manner such as the flip-chip manner. The common contact COM of the light-emitting diode package LEDPG1 is in direct electrical contact with the common contact VCOM of the driver circuit chip DRV1.

Figure 7:
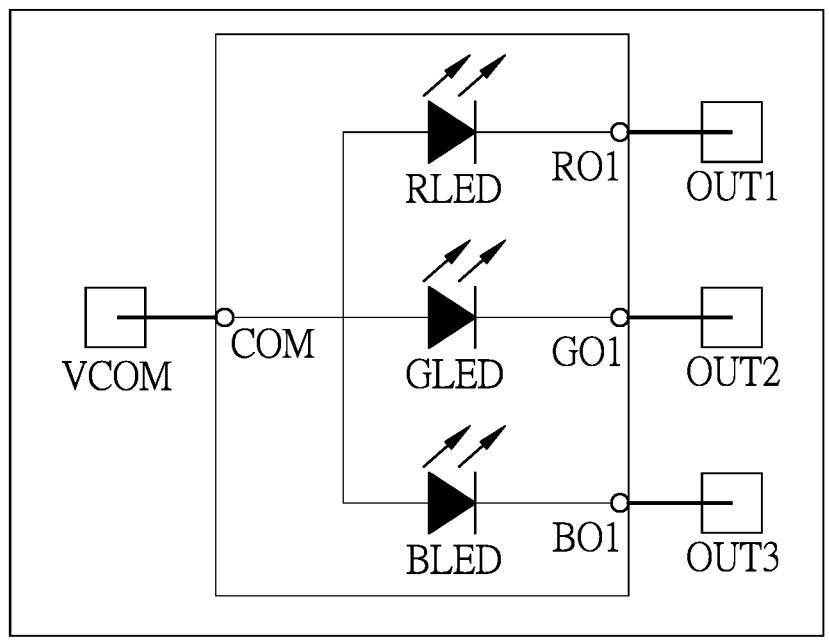
FIG. 7 is a schematic diagram of a light-emitting diode package having a common contact of anodes that is in direct electrical contact with the common contact of the driver circuit chip and having cathodes that are in direct electrical contact with the output contacts of the driver circuit chip in the light-emitting diode device with the driving mechanism according to the fifth embodiment of the present disclosure.

Reference is made to FIG. 7, which is a schematic diagram of a light-emitting diode package having a common contact of anodes that is in direct electrical contact with the common contact of the driver circuit chip and having cathodes that are in direct electrical contact with the output contacts of the driver circuit chip in the light-emitting diode device with the driving mechanism according to the fifth embodiment of the present disclosure.

As shown in FIG. 7, the common contact VCOM of the driver circuit chip DRV1 is in direct electrical contact with the common contact COM of the anode of the first light-emitting diode chip RLED, the anode of the second light-emitting diode chip GLED, the anode of the third light-emitting diode chip BLED in the light-emitting diode package LEDPG1.

The first output contact OUT1 of the driver circuit chip DRV1 is in direct electrical contact with the first contact RO1 of the cathode of the first light-emitting diode chip RLED in the light-emitting diode package LEDPG1. The second output contact OUT2 of the driver circuit chip DRV1 is in direct electrical contact with the first contact GO1 of the cathode of the second light-emitting diode chip GLED in the light-emitting diode package LEDPG1. The third output contact OUT3 of the driver circuit chip DRV1 is in direct electrical contact with the first contact BO1 of the cathode of the third light-emitting diode chip BLED.

Figure 8:
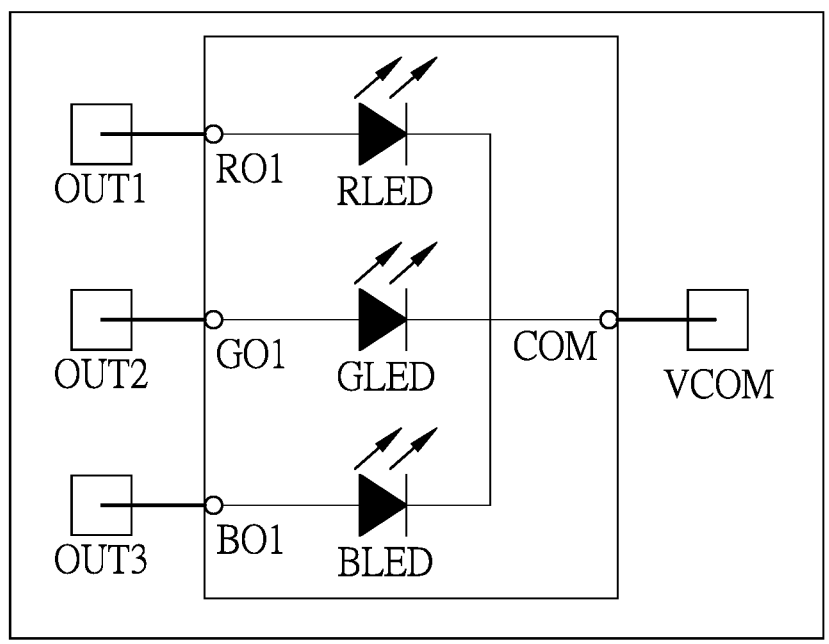
FIG. 8 is a schematic diagram of a light-emitting diode package having a common contact of cathodes that is in direct electrical contact with the common contact of the driver circuit chip and having anodes that are in direct electrical contact with the output contacts of the driver circuit chip in the light-emitting diode device with the driving mechanism according to the sixth embodiment of the present disclosure.

Reference is made to FIG. 8, which is a schematic diagram of a light-emitting diode package having a common contact of cathodes that is in direct electrical contact with the common contact of the driver circuit chip and having anodes that are in direct electrical contact with the output contacts of the driver circuit chip in the light-emitting diode device with the driving mechanism according to the sixth embodiment of the present disclosure.

As shown in FIG. 8, the first output contact OUT1 of the driver circuit chip DRV1 is in direct electrical contact with the first contact RO1 of the anode of the first light-emitting diode chip RLED in the light-emitting diode package LEDPG1. The second output contact OUT2 of the driver circuit chip DRV1 is in direct electrical contact with the first contact GO1 of the anode of the second light-emitting diode chip GLED. The third output contact OUT3 of the driver circuit chip DRV1 is in direct electrical contact with the first contact BO1 of the anode of the third light-emitting diode chip BLED.

The common contact VCOM of the driver circuit chip DRV1 is in direct electrical contact with the common contact COM of the cathode of the first light-emitting diode chip RLED, the cathode of the second light-emitting diode chip GLED, the cathode of the third light-emitting diode chip BLED in the light-emitting diode package LEDPG1.

Figure 9:
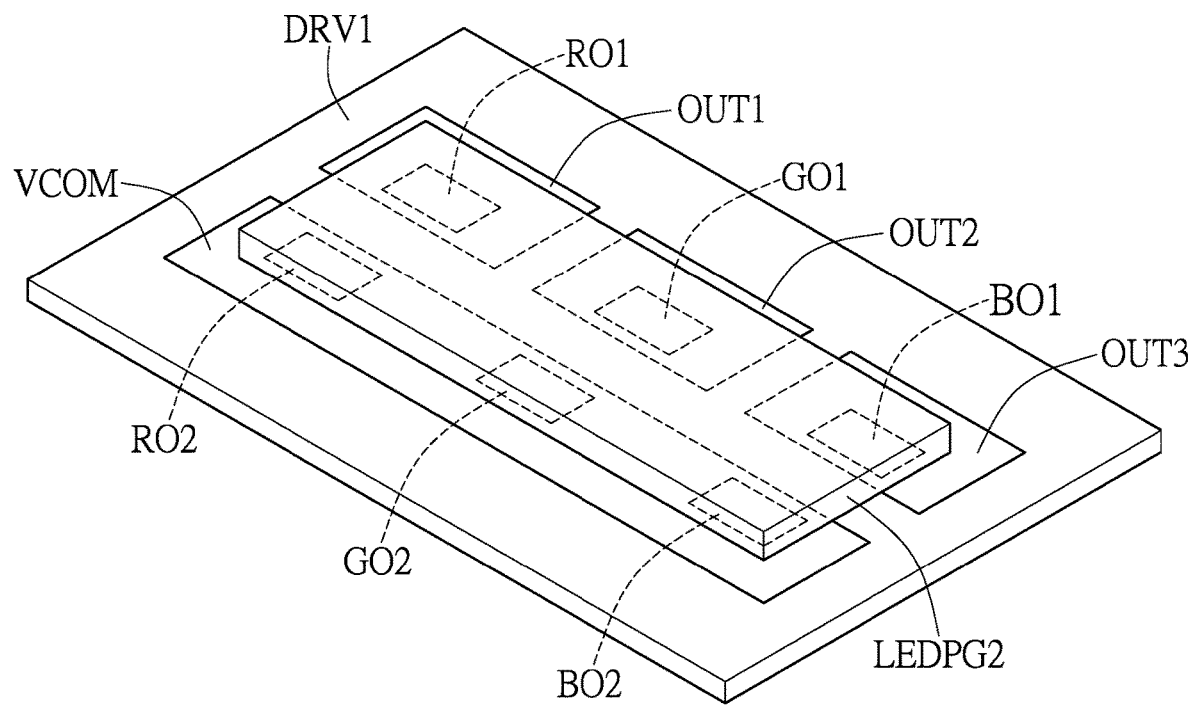
FIG. 9 is a schematic diagram of a light-emitting diode package disposed on the driver circuit chip in the light-emitting diode device with the driving mechanism according to the seventh embodiment of the present disclosure.

Reference is made to FIG. 9, which is a schematic diagram of a light-emitting diode package disposed on the driver circuit chip in the light-emitting diode device with the driving mechanism according to the seventh embodiment of the present disclosure.

In the embodiment, the light-emitting diode device may include a light-emitting diode package LEDPG2 shown in FIG. 9. The light-emitting diode package LEDPG2 may include the first light-emitting diode chip RLED, the second light-emitting diode chip GLED, the third light-emitting diode chip BLED as shown in FIG. 1, and an encapsulation layer. As shown in FIG. 9, the light-emitting diode package LEDPG2 may have the first contacts RO1, GO1, BO1 and the second contacts RO2, GO2, BO2.

As shown in FIG. 9, in the embodiment, the light-emitting diode device includes the light-emitting diode package LEDPG2 and the driver circuit chip DRV1. The light-emitting diode package LEDPG2 may be disposed on the driver circuit chip DRV1. The first contact RO1 of the light-emitting diode package LEDPG2 is in direct electrical contact with the first output contact OUT1 of the driver circuit chip DRV1. The first contact GO1 of the light-emitting diode package LEDPG2 is in direct electrical contact with the second output contact OUT2 of the driver circuit chip DRV1. The first contact BO1 of the light-emitting diode package LEDPG2 is in direct electrical contact with the third output contact OUT3 of the driver circuit chip DRV1. The second contacts RO2, GO2, BO2 of the light-emitting diode package LEDPG2 are in direct electrical contact with the common contact VCOM of the driver circuit chip DRV1.

Figure 10:
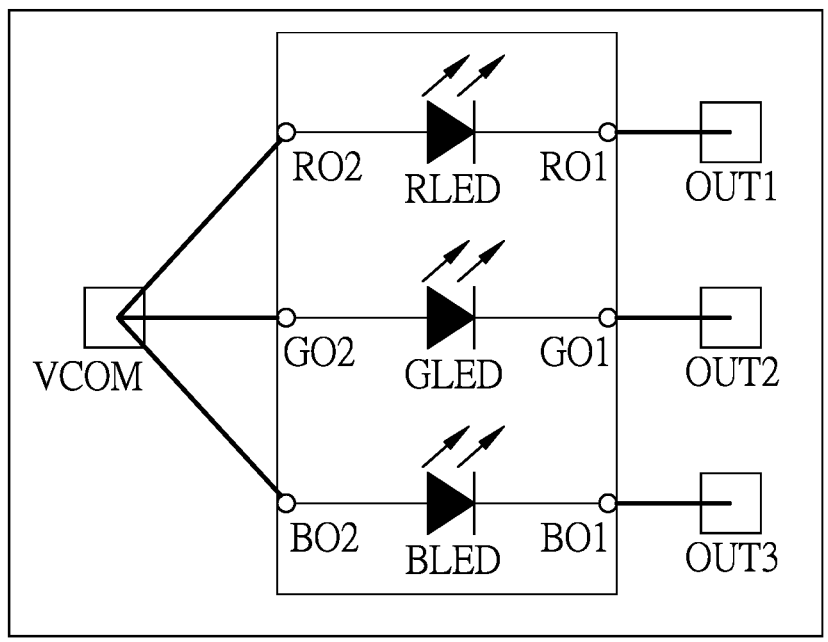
FIG. 10 is a schematic diagram of a light-emitting diode package having a common contact of anodes that is in direct electrical contact with the common contact of the driver circuit chip and having cathodes that are in direct electrical contact with the output contacts of the driver circuit chip in the light-emitting diode device with the driving mechanism according to the eighth embodiment of the present disclosure.

Reference is made to FIG. 10, which is a schematic diagram of a light-emitting diode package having a common contact of anodes that is in direct electrical contact with the common contact of the driver circuit chip and having cathodes that are in direct electrical contact with the output contacts of the driver circuit chip in the light-emitting diode device with the driving mechanism according to the eighth embodiment of the present disclosure.

As shown in FIG. 10, the light-emitting diode package LEDPG2 has the first contacts RO1, GO1, BO1 and the second contacts RO2, GO2, BO2.

The first contact RO1 of the cathode of the first light-emitting diode chip RLED of the light-emitting diode package LEDPG2 is in direct electrical contact with the first output contact OUT1 of the driver circuit chip DRV1. The first contact GO1 of the cathode of the second light-emitting diode chip GLED of the light-emitting diode package LEDPG2 is in direct electrical contact with the second output contact OUT2 of the driver circuit chip DRV1. The first contact BO1 of the cathode of the third light-emitting diode chip BLED of the light-emitting diode package LEDPG2 is in direct electrical contact with the third output contact OUT3 of the driver circuit chip DRV1.

In the light-emitting diode package LEDPG2, the second contact RO2 of the anode of the first light-emitting diode chip RLED, the second contact GO2 of the anode of the second light-emitting diode chip GLED and the second contact BO2 of the anode of the third light-emitting diode chip BLED are in direct electrical contact with the common contact VCOM of the driver circuit chip DRV1.

Figure 11:
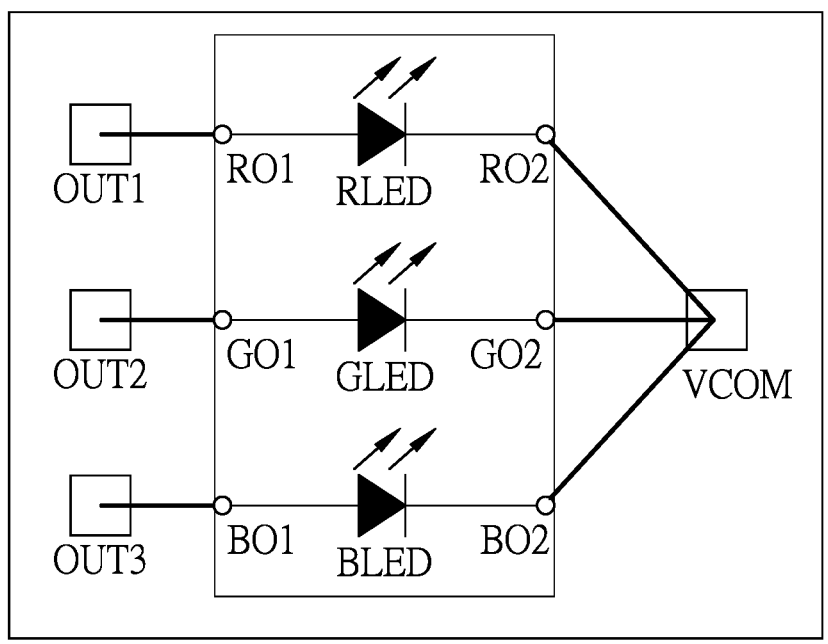
FIG. 11 is a schematic diagram of a light-emitting diode package having a common contact of cathodes that is in direct electrical contact with the common contact of the driver circuit chip and having anodes that are in direct electrical contact with the output contacts of the driver circuit chip in the light-emitting diode device with the driving mechanism according to the ninth embodiment of the present disclosure.

Reference is made to FIG. 11, which is a schematic diagram of a light-emitting diode package having a common contact of cathodes that is in direct electrical contact with the common contact of the driver circuit chip and having anodes that are in direct electrical contact with the output contacts of the driver circuit chip in the light-emitting diode device with the driving mechanism according to the ninth embodiment of the present disclosure.

As shown in FIG. 11, the light-emitting diode package LEDPG2 has the first contacts RO1, GO1, BO1 and the second contacts RO2, GO2, BO2.

The first contact RO1 of the anode of the first light-emitting diode chip RLED of the light-emitting diode package LEDPG2 is in direct electrical contact with the first output contact OUT1 of the driver circuit chip DRV1. The first contact GO1 of the anode of the second light-emitting diode chip GLED of the light-emitting diode package LEDPG2 is in direct electrical contact with the second output contact OUT2 of the driver circuit chip DRV1. The first contact BO1 of the anode of the third light-emitting diode chip BLED of the light-emitting diode package LEDPG2 is in direct electrical contact with the third output contact OUT3 of the driver circuit chip DRV1.

In the light-emitting diode package LEDPG2, the second contact RO2 of the cathode of the first light-emitting diode chip RLED, the second contact GO2 of the cathode of the second light-emitting diode chip GLED and the second contact BO2 of the cathode of the third light-emitting diode chip BLED are in direct electrical contact with the common contact VCOM of the driver circuit chip DRV1.

Figure 12:
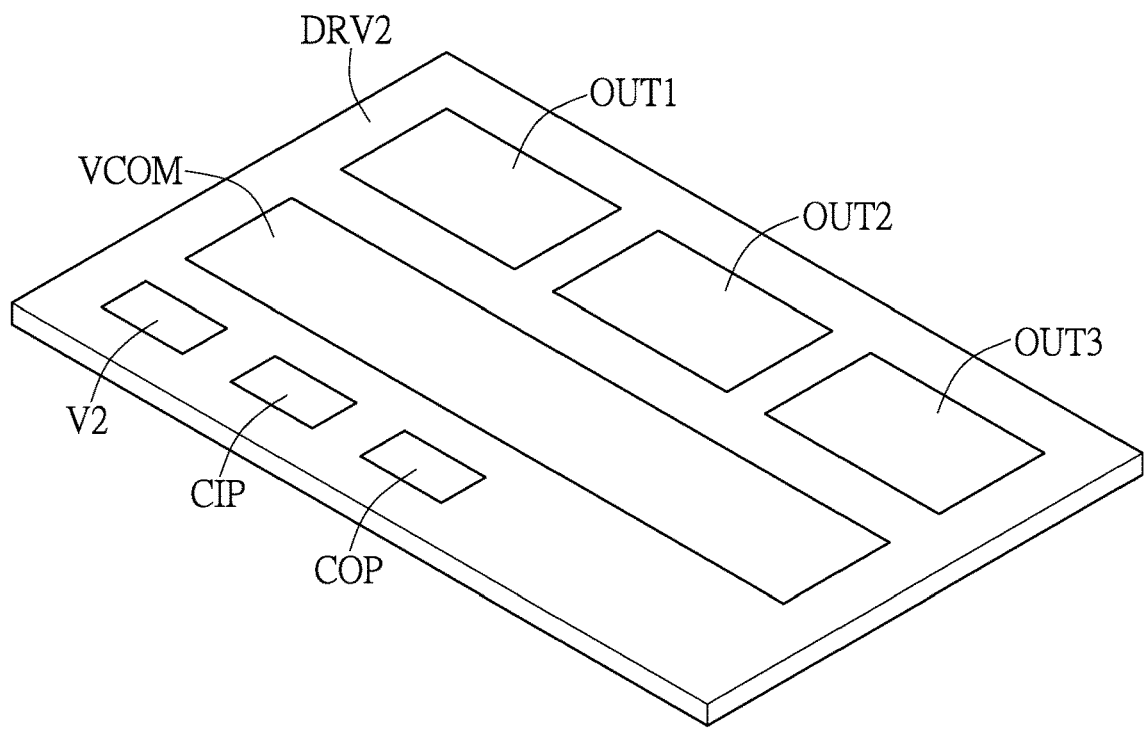
FIG. 12 is a schematic diagram of a driver circuit chip of a light-emitting diode device with a driving mechanism according to a tenth embodiment of the present disclosure.

Reference is made to FIG. 12, which is a schematic diagram of a driver circuit chip of a light-emitting diode device with a driving mechanism according to a tenth embodiment of the present disclosure.

The light-emitting diode device may include a driver circuit chip DRV2 shown in FIG. 12 that may replace the driver circuit chip DRV1 described above. The first light-emitting diode chip RLED, the second light-emitting diode chip GLED and the third light-emitting diode chip BLED as described above may be disposed on the driver circuit chip DRV2 and in direct electrical contact with the driver circuit chip DRV2. Alternatively, the light-emitting diode package LEDPG1 described above may be disposed on the driver circuit chip DRV2 and in direct electrical contact with the driver circuit chip DRV2. Alternatively, the light-emitting diode package LEDPG2 described above may be disposed on the driver circuit chip DRV2 and in direct electrical contact with the driver circuit chip DRV2.

Compared with the driver circuit chip DRV1 shown in FIG. 2, the driver circuit chip DRV2 shown in FIG. 12 has the first output contact OUT1, the second output contact OUT2, the third output contact OUT3 and the common contact VCOM, and further has an electrical contact pad V2, a serial data input pad CIP and a serial data output pad COP.

If the common contact VCOM of the driver circuit chip DRV2 is connected to an input voltage source, the electrical contact pad V2 of the driver circuit chip DRV2 is grounded. Conversely, if the common contact VCOM of the driver circuit chip DRV2 is grounded, the electrical contact pad V2 of the driver circuit chip DRV2 is connected to the input voltage source.

The common contact VCOM of the driver circuit chip DRV2, the electrical contact pad V2, the serial data input pad CIP, the serial data output pad COP may be connected to external wires through bonding wires, through-silicon vias, or metal layers formed along sides of the driver circuit chip DRV2.

In the embodiment, the driving circuit chip DRV2 transmits signals and data in a single-wire transmission manner. In detail, the serial data input pad CIP of the driving circuit chip DRV2 may receive a signal and the serial data output pad COP may output the signal. For example, the signal may be a first control signal for controlling the first light-emitting diode chip RLED, the second light-emitting diode chip GLED and the third light-emitting diode chip BLED, but the present disclosure is not limited thereto.

Figure 13:
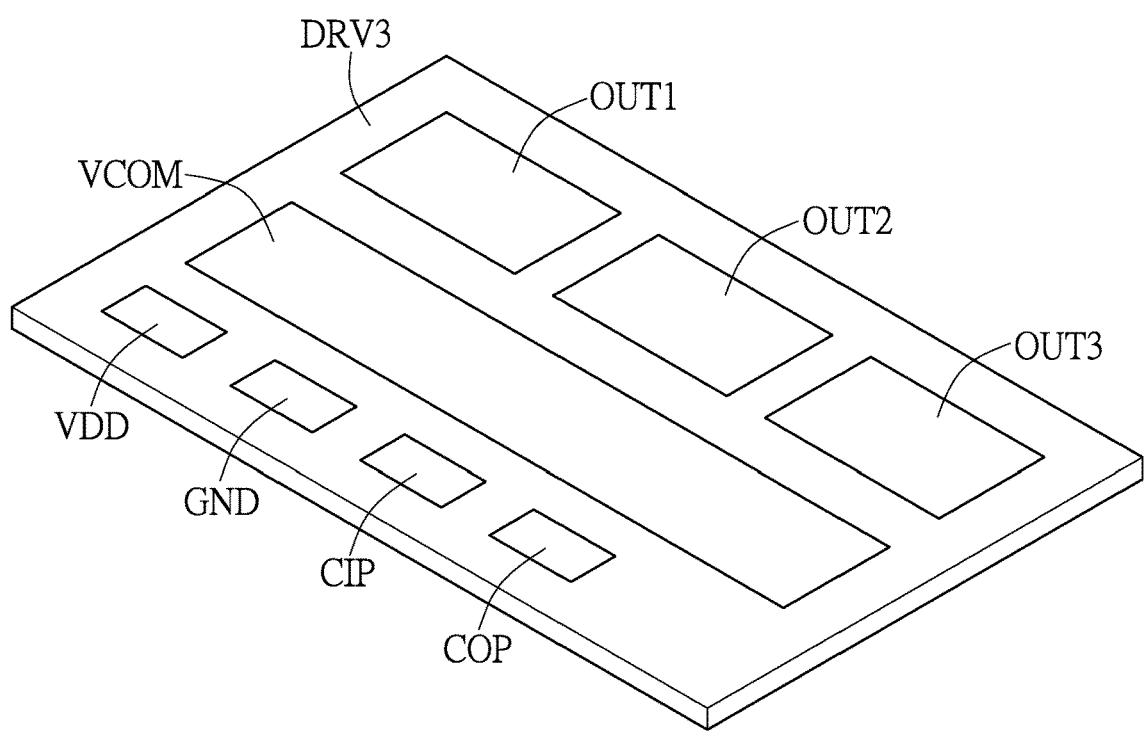
FIG. 13 is a schematic diagram of a driver circuit chip of a light-emitting diode device with a driving mechanism according to an eleventh embodiment of the present disclosure.

Reference is made to FIG. 13, which is a schematic diagram of a driver circuit chip of a light-emitting diode device with a driving mechanism according to an eleventh embodiment of the present disclosure.

The light-emitting diode device may include a driver circuit chip DRV3 shown in FIG. 13 that may replace the driver circuit chip DRV1 described above. The first light-emitting diode chip RLED, the second light-emitting diode chip GLED and the third light-emitting diode chip BLED as described above may be disposed on the driver circuit chip DRV3, and in direct electrical contact with the driver circuit chip DRV3. Alternatively, the light-emitting diode package LEDPG1 described above may be disposed on the driver circuit chip DRV3, and in direct electrical contact with the driver circuit chip DRV3. Alternatively, the light-emitting diode package LEDPG2 described above may be disposed on the driver circuit chip DRV3, and in direct electrical contact with the driver circuit chip DRV3.

Compared with the driver circuit chip DRV1 shown in FIG. 2, the driver circuit chip DRV3 shown in FIG. 13 has the first output contact OUT1, the second output contact OUT2, the third output contact OUT3 and the common contact VCOM, and further has an input power pad VDD, a ground pad GND, the serial data input pad CIP and the serial data output pad COP.

The input power pad VDD of the driver circuit chip DRV3 is connected to the input voltage source. The ground pad GND of the driver circuit chip DRV3 is grounded. The common contact VCOM of the driver circuit chip DRV3 may be in direct electrical contact with the input power pad VDD or the ground pad GND.

The common contact VCOM of the driver circuit chip DRV3, the input power pad VDD, the ground pad GND, the serial data input pad CIP and the serial data output pad COP may be connected to external wires through bonding wires, through-silicon vias, or metal layers formed along sides of the driver circuit chip DRV3.

In the embodiment, the driving circuit chip DRV3 transmits signals and data in a single-wire transmission manner. In detail, the serial data input pad CIP of the driving circuit chip DRV3 may receive a signal and the serial data output pad COP may output the signal. For example, the signal may be a first control signal for controlling the above-mentioned first light-emitting diode chip RLED, second light-emitting diode chip GLED and third light-emitting diode chip BLED, but the present disclosure is not limited thereto.

Figure 14:
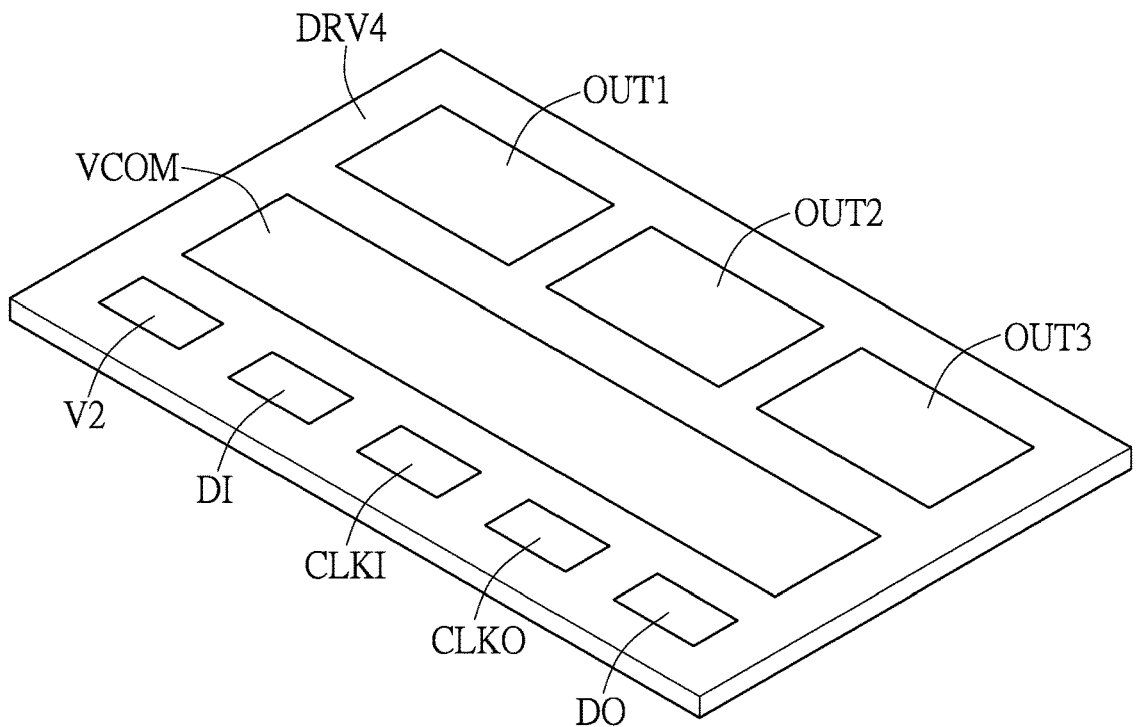
FIG. 14 is a schematic diagram of a driver circuit chip of a light-emitting diode device with a driving mechanism according to a twelfth embodiment of the present disclosure.

Reference is made to FIG. 14, which is a schematic diagram of a driver circuit chip of a light-emitting diode device with a driving mechanism according to a twelfth embodiment of the present disclosure.

The light-emitting diode device may include a driver circuit chip DRV4 shown in FIG. 14 that may replace the driver circuit chip DRV1 described above. The first light-emitting diode chip RLED, the second light-emitting diode chip GLED and the third light-emitting diode chip BLED as described above may be disposed on the driver circuit chip DRV4 and in direct electrical contact with the driver circuit chip DRV4. Alternatively, the light-emitting diode package LEDPG1 described above may be disposed on the driver circuit chip DRV4 and in direct electrical contact with the driver circuit chip DRV4. Alternatively, the light-emitting diode package LEDPG2 described above may be disposed on the driver circuit chip DRV4 and in direct electrical contact with the driver circuit chip DRV4.

Compared with the driver circuit chip DRV1 shown in FIG. 2, the driver circuit chip DRV4 shown in FIG. 14 has the first output contact OUT1, the second output contact OUT2, the third output contact OUT3 and the common contact VCOM, and further has the electrical contact pad V2, a serial data input pad DI, a serial clock input pad CLKI and a serial clock output pad CLKO and a serial data output pad DO.

If the common contact VCOM of the driver circuit chip DRV4 is connected to the input voltage source, the electrical contact pad V2 of the driver circuit chip DRV4 is grounded. Conversely, if the common contact VCOM of the driver circuit chip DRV4 is grounded, the electrical contact pad V2 of the driver circuit chip DRV4 is connected to the input voltage source.

The common contact VCOM of the driver circuit chip DRV4, the electrical contact pad V2, the serial data input pad DI, the serial clock input pad CLKI and the serial clock output pad CLKO and the serial data output pad DO may be connected to external wires through bonding wires, through-silicon vias, or metal layers formed along sides of the driver circuit chip DRV4.

In the embodiment, the driving circuit chip DRV4 transmits signals and data in a double-wire transmission manner. In detail, the serial data input pad DI of the driving circuit chip DRV4 may receive a first control signal, the serial clock input pad CLKI of the driving circuit chip DRV4 may receive a second control signal. The serial data output pad DO of the driving circuit chip DRV4 may output the first control signal, and the serial clock output pad CLKO of the driving circuit chip DRV4 may output the second control signal. The first light-emitting diode chip RLED, the second light-emitting diode chip GLED and the third light-emitting diode chip BLED are controlled by the first control signal and the second control signal.

Figure 15:
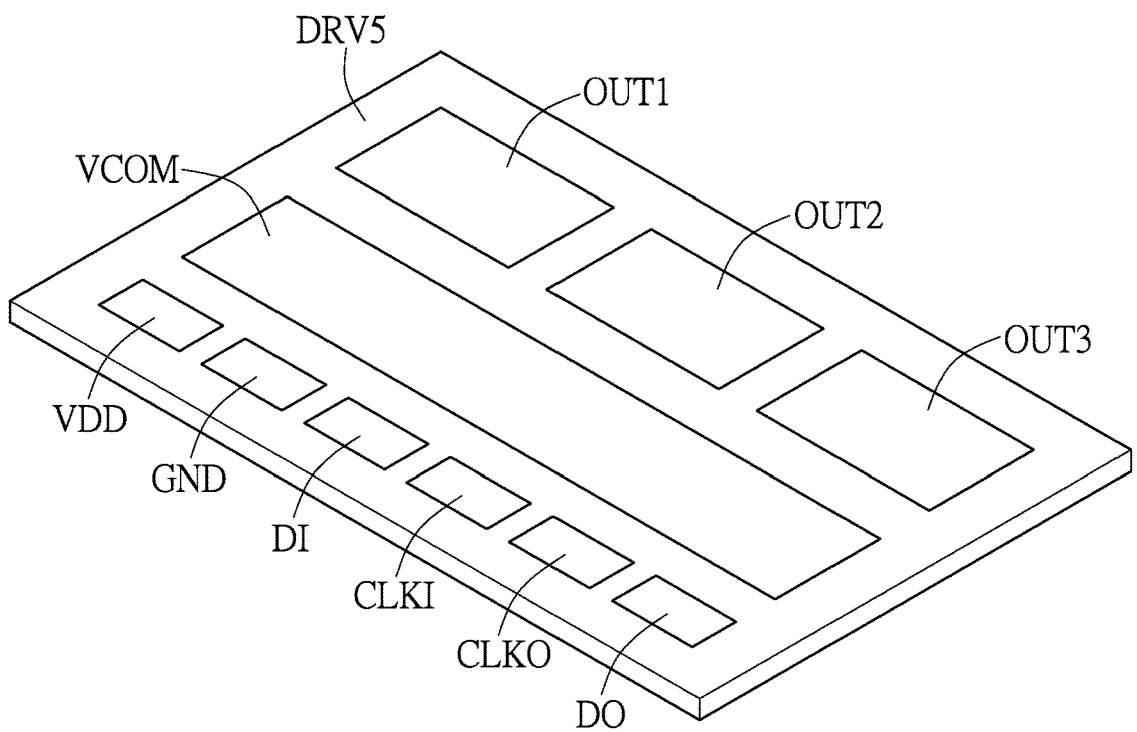
FIG. 15 is a schematic diagram of a driver circuit chip of a light-emitting diode device with a driving mechanism according to a thirteenth embodiment of the present disclosure.

Reference is made to FIG. 15, which is a schematic diagram of a driver circuit chip of a light-emitting diode device with a driving mechanism according to a thirteenth embodiment of the present disclosure.

The light-emitting diode device may include a driver circuit chip DRV5 shown in FIG. 15 that may replace the driver circuit chip DRV1 described above. The first light-emitting diode chip RLED, the second light-emitting diode chip GLED and the third light-emitting diode chip BLED as described above may be disposed on the driver circuit chip DRV5 and in direct electrical contact with the driver circuit chip DRV5. Alternatively, the light-emitting diode package LEDPG1 described above may be disposed on the driver circuit chip DRV5 and in direct electrical contact with the driver circuit chip DRV5. Alternatively, the light-emitting diode package LEDPG2 described above may be disposed on the driver circuit chip DRV5 and in direct electrical contact with the driver circuit chip DRV5.

Compared with the driver circuit chip DRV1 shown in FIG. 2, the driver circuit chip DRV5 shown in FIG. 15 has the first output contact OUT1, the second output contact OUT2, the third output contact OUT3 and the common contact VCOM, and further has the input power pad VDD, the ground pad GND, the serial data input pad DI, the serial clock input pad CLKI, the serial clock output pad CLKO and the serial data output pad DO. The input power pad VDD is connected to the input voltage source. The ground pad GND is grounded. The common contact VCOM of the driver circuit chip DRV5 may be in direct electrical contact with the input power pad VDD or the ground pad GND.

The common contact VCOM of the driver circuit chip DRV5, the input power pad VDD, the ground pad GND, the serial data input pad DI, the serial clock input pad CLKI, the serial clock output pad CLKO and the serial data output pad DO may be connected to external wires through bonding wires, through-silicon vias, or metal layers formed along sides of the driver circuit chip DRV5.

In the embodiment, the driving circuit chip DRV5 transmits signals and data in a double-wire transmission manner. In detail, the serial data input pad DI of the driving circuit chip DRV5 may receive a first control signal, the serial clock input pad CLKI of the driving circuit chip DRV5 may receive a second control signal. The serial data output pad DO of the driving circuit chip DRV5 may output the first control signal, and the serial clock output pad CLKO of the driving circuit chip DRV5 may output the second control signal. The first light-emitting diode chip RLED, second light-emitting diode chip GLED and third light-emitting diode chip BLED are controlled by the first control signal and the second control signal.

In summary, the present disclosure provides the light-emitting diode device with the driving mechanism, which includes the plurality of light-emitting diode chips stacked on the driving circuit chip. The light-emitting diode chips are in direct electrical contact with the driving circuit chip without using bonding wires, thereby saving an area of the light-emitting diode device. Therefore, a size of the light-emitting diode device of the present disclosure can be minimized, and the light emitted by the light-emitting diode chips cannot be blocked by the driver circuit chip such that a mixing quality of the light is optimized.

The foregoing description of the exemplary embodiments of the disclosure has been presented only for the purposes of illustration and description and is not intended to be exhaustive or to limit the disclosure to the precise forms disclosed. Many modifications and variations are possible in light of the above teaching.

The embodiments were chosen and described in order to explain the principles of the disclosure and their practical application so as to enable others skilled in the art to utilize the disclosure and various embodiments and with various modifications as are suited to the particular use contemplated. Alternative embodiments will become apparent to those skilled in the art to which the present disclosure pertains without departing from its spirit and scope.

What is claimed is:

1. A light-emitting diode device with a driving mechanism, comprising:
    a first light-emitting diode chip configured to emit red light;
    a second light-emitting diode chip configured to emit green light;
    a third light-emitting diode chip configured to emit blue light; and
    a driver circuit chip being in direct electrical contact with the first light-emitting diode chip, the second light-emitting diode chip and the third light-emitting diode chip, and configured to drive the first light-emitting diode chip to emit the red light, the second light-emitting diode chip to emit the green light and the third light-emitting diode chip to emit the blue light;
    wherein the first light-emitting diode chip, the second light-emitting diode chip and the third light-emitting diode chip are disposed on the driver circuit chip;
    wherein a first contact of the first light-emitting diode chip is in direct electrical contact with a first output contact of the driver circuit chip in a flip-chip manner, a first contact of the second light-emitting diode chip is in direct electrical contact with a second output contact of the driver circuit chip in the flip-chip manner, and a first contact of the third light-emitting diode chip is in direct electrical contact with a third output contact of the driver circuit chip in the flip-chip manner;
    wherein any two or three of a second contact of the first light-emitting diode chip, a second contact of the second light-emitting diode chip and a second contact of the third light-emitting diode chip are in direct electrical contact with a common contact of the driver circuit chip.

2. The light-emitting diode device according to claim 1, wherein a total area of the first light-emitting diode chip, the second light-emitting diode chip and the third light-emitting diode chip is smaller than an area of the driver circuit chip.

3. The light-emitting diode device according to claim 1, wherein the first contacts of the first light-emitting diode chip, the second light-emitting diode chip and the third light-emitting diode chip are cathodes;
    the second contacts of the first light-emitting diode chip, the second light-emitting diode chip and the third light-emitting diode chip are anodes.

4. The light-emitting diode device according to claim 1, wherein the first contacts of the first light-emitting diode chip, the second light-emitting diode chip and the third light-emitting diode chip are anodes;
    the second contacts of the first light-emitting diode chip, the second light-emitting diode chip and the third light-emitting diode chip are cathodes.

5. The light-emitting diode device according to claim 1, wherein the driver circuit chip has an electrical contact pad, a serial data input pad and a serial data output pad, the electrical contact pad is grounded, the common contact of the driver circuit chip is connected to an input voltage source;
    wherein the serial data input pad receives a first control signal, the serial data output pad outputs the first control signal, the first light-emitting diode chip, the second light-emitting diode chip and the third light-emitting diode chip emit light according to the first control signal.

6. The light-emitting diode device according to claim 5, wherein the driver circuit chip further has a serial clock input pad and a serial clock output pad;
    wherein the serial clock input pad receives a second control signal, the serial clock output pad outputs the second control signal, and the first light-emitting diode chip, the second light-emitting diode chip and the third light-emitting diode chip emit light according to the first control signal and the second control signal.

7. The light-emitting diode device according to claim 6, wherein one or more of the common contact of the driver circuit chip, the electrical contact pad, the serial data input pad, the serial data output pad, the serial clock input pad and the serial clock output pad are connected to external wires through bonding wires, through-silicon vias, or metal layers formed along sides of the driver circuit chip.

8. The light-emitting diode device according to claim 1, wherein the driver circuit chip has an electrical contact pad, a serial data input pad and a serial data output pad, the electrical contact pad is connected to an input voltage source, and the common contact of the driver circuit chip is grounded;
   wherein the serial data input pad receives a first control signal, the serial data output pad outputs the first control signal, and the first light-emitting diode chip, the second light-emitting diode chip and the third light-emitting diode chip emit light according to the first control signal.

9. The light-emitting diode device according to claim 8, wherein the driver circuit chip further has a serial clock input pad and a serial clock output pad;
   wherein the serial clock input pad receives a second control signal, the serial clock output pad outputs the second control signal, and the first light-emitting diode chip, the second light-emitting diode chip and the third light-emitting diode chip emit light according to the first control signal and the second control signal.

10. The light-emitting diode device according to claim 9, wherein one or more of the common contact of the driver circuit chip, the electrical contact pad, the serial data input pad, the serial data output pad, the serial clock input pad and the serial clock output pad are connected to external wires through bonding wires, through-silicon vias, or metal layers formed along sides of the driver circuit chip.

11. The light-emitting diode device according to claim 1, wherein the driver circuit chip has an input power pad, a ground pad, a serial data input pad and a serial data output pad, the input power pad is connected to an input voltage source, the ground pad is grounded, and the common contact of the driver circuit chip is connected to the input power pad;
   wherein the serial data input pad receives a first control signal, the serial data output pad outputs the first control signal, and the first light-emitting diode chip, the second light-emitting diode chip and the third light-emitting diode chip emit light according to the first control signal.

12. The light-emitting diode device according to claim 11, wherein the driver circuit chip further has a serial clock input pad and a serial clock output pad;
   wherein the serial clock input pad receives a second control signal, the serial clock output pad outputs the second control signal, and the first light-emitting diode chip, the second light-emitting diode chip and the third light-emitting diode chip emit light according to the first control signal and the second control signal.

13. The light-emitting diode device according to claim 12, wherein one or more of the common contact of the driver circuit chip, the input power pad, the ground pad, the serial data input pad, the serial data output pad, the serial clock input pad and the serial clock output pad are connected to external wires through bonding wires, through-silicon vias, or metal layers formed along sides of the driver circuit chip.

14. The light-emitting diode device according to claim 1, wherein the driver circuit chip has an input power pad, a ground pad, a serial data input pad and a serial data output pad, the input power pad is connected to an input voltage source, the ground pad is grounded, and the common contact of the driver circuit chip is connected to the ground pad;
   wherein the serial data input pad receives a first control signal, the serial data output pad outputs the first control signal, and the first light-emitting diode chip, the second light-emitting diode chip and the third light-emitting diode chip emit light according to the first control signal.

15. The light-emitting diode device according to claim 14, wherein the driver circuit chip further has a serial clock input pad and a serial clock output pad;
   wherein the serial clock input pad receives a second control signal, the serial clock output pad outputs the second control signal, the first light-emitting diode chip, the second light-emitting diode chip and the third light-emitting diode chip emit light according to the first control signal and the second control signal.

16. The light-emitting diode device according to claim 15, wherein one or more of the common contact of the driver circuit chip, the input power pad, the ground pad, the serial data input pad, the serial data output pad, the serial clock input pad and the serial clock output pad are connected to external wires through bonding wires, through-silicon vias, or metal layers formed along sides of the driver circuit chip.

17. A light-emitting diode device with a driving mechanism, comprising:
   a light-emitting diode package including a first light-emitting diode chip, a second light-emitting diode chip, a third light-emitting diode chip and an encapsulation layer, wherein the first light-emitting diode chip is configured to emit red light, the second light-emitting diode chip is configured to emit green light, and the third light-emitting diode chip is configured to emit blue light; and
   a driver circuit chip being in direct electrical contact with the first light-emitting diode chip, the second light-emitting diode chip and the third light-emitting diode chip, and configured to drive the first light-emitting diode chip to emit the red light, the second light-emitting diode chip to emit the green light and the third light-emitting diode chip to emit the blue light;
   wherein the first light-emitting diode chip, the second light-emitting diode chip and the third light-emitting diode chip are disposed on the driver circuit chip;
   wherein a first contact of the first light-emitting diode chip is in direct electrical contact with a first output contact of the driver circuit chip, a first contact of the second light-emitting diode chip is in direct electrical contact with a second output contact of the driver circuit chip, and a first contact of the third light-emitting diode chip is in direct electrical contact with a third output contact of the driver circuit chip;
   wherein a common contact of a second contact of the first light-emitting diode chip, a second contact of the second light-emitting diode chip and a second contact of the third light-emitting diode chip is in direct electrical contact with a common contact of the driver circuit chip.

* * * * *